(12) United States Patent
Ku et al.

(10) Patent No.: US 9,500,675 B2
(45) Date of Patent: Nov. 22, 2016

(54) PROBE MODULE SUPPORTING LOOPBACK TEST

(71) Applicant: MPI CORPORATION, Zhubei (TW)

(72) Inventors: Wei-Cheng Ku, Zhubei (TW); Jun-Liang Lai, Zhubei (TW); Wei Chen, Kaohsiung (TW); Hsin Hsiang Liu, Guansi Township (TW); Kuang Chung Chou, Taipei (TW); Chan Hung Huang, Qionglin Township (TW)

(73) Assignee: MPI CORPORATION, Zhubei (TW)

( * ) Notice: Subject to any disclaimer, the term of this patent is extended or adjusted under 35 U.S.C. 154(b) by 204 days.

(21) Appl. No.: 14/331,610

(22) Filed: Jul. 15, 2014

(65) Prior Publication Data

US 2015/0015290 A1    Jan. 15, 2015

(30) Foreign Application Priority Data

Jul. 15, 2013 (TW) .............. 102125236 A
Jul. 9, 2014 (TW) .............. 103123676 A

(51) Int. Cl.
*G01R 1/073* (2006.01)

(52) U.S. Cl.
CPC ....... *G01R 1/07385* (2013.01); *G01R 1/07378* (2013.01)

(58) Field of Classification Search
CPC .......... G01R 1/07307; G01R 1/07385; G01R 1/07378; G01R 1/06772; G01R 1/07; G01R 1/07314; G01R 1/06711; G01R 31/2889; G01R 31/025; G01R 31/2875
See application file for complete search history.

(56) References Cited

U.S. PATENT DOCUMENTS

2006/0290357 A1* 12/2006 Campbell .......... G01R 1/06766
                                                        324/600
2007/0245179 A1    10/2007 Noda

FOREIGN PATENT DOCUMENTS

| CN | 1860377   | 11/2006 |
| TW | 312825    | 8/1997  |
| TW | 580744    | 3/2004  |
| TW | 201245741 | 11/2012 |
| TW | 201250764 | 12/2012 |

* cited by examiner

*Primary Examiner* — Son Le
*Assistant Examiner* — Brent J Andrews
(74) *Attorney, Agent, or Firm* — Lynette Wylie; Apex Juris, pllc.

(57) ABSTRACT

A probe module, which supports loopback test and is provided between a PCB and a DUT, includes a substrate, a probe base, two probes, two signal path switchers, and a capacitor. The substrate has two first connecting circuits and two second connecting circuits, wherein an end of each first connecting circuit is connected to the PCB. The probe base is provided between the substrate and the DUT with the probes provided thereon, wherein an end of each probe is exposed and electrically connected to one second connecting circuit, while another end thereof is also exposed to contact the DUT. Each signal path switcher is provided on the probe base, and respectively electrically connected to another end of one first and one second connecting circuits. The capacitor is provided on the probe base with two ends electrically connected to the two signal path switchers.

15 Claims, 10 Drawing Sheets

PROBE MODULE SUPPORTING LOOPBACK TEST

BACKGROUND OF THE INVENTION

1. Technical Field

The present invention relates generally to a probe, and more particularly to a probe module which supports loopback test.

2. Description of Related Art

To test if every electronic component of a device-under-test (DUT) is electrically connected correctly, a widely used method is to apply a probe card between a tester and the DUT, wherein the probe card is functioned as a transmission interface which transmits test signals and power signals therebetween.

However, with the advancement of digital technology, the operating speed and the signal throughput of electronic devices are increasing, which makes the frequencies of test signals generated by processors of the tester insufficient to satisfy the demand for testing such electronic devices. In order to solve such problem, a DUT may therefore be utilized to generate high-frequency signals by itself, and those signals are then transmitted back to the DUT again via a probe card to perform testing.

As shown in FIG. 1, a conventional probe card has a plurality of relays 72 provided on a printed circuit board (PCB) 70 thereof, wherein conductor patters on the PCB 70 are designed in a way that each relay 72 can be controlled to switch between signal paths of DC test signals provided by a tester 300 and that of high-frequency test signals provided by the DUT 400 for loopback test. In other words, the relays are used as signal path switchers. It is well known that, with longer signal path, there would be higher inductance generated thereon. In other words, since each of the signal paths of the high-frequency test signals is quite long, which starts from a probe module 80, sequentially goes through the PCB 70, one of the relays 72, one of capacitors 74, and finally goes back to the probe module 80 through another one of the relays 72 and the PCB 70 again, test signals of higher frequency would lead to higher inductance generated along the signal paths, and therefore cause higher resistance as well. As a result, some of the high-frequency test signals may not be successfully transmitted to the DUT 400, which obviously hinders the process of test.

BRIEF SUMMARY OF THE INVENTION

In view of the above, the primary objective of the present invention is to provide a probe module, which supports loopback test, and effectively shortens the distance to transmit high-frequency signals in a loopback test.

The present invention provides a probe module, which is provided between a printed circuit board (PCB) and a device-under-test (DUT) to perform a loopback test, including a substrate, a probe base, two probes, two signal path switchers, and a capacitor. The substrate has two first connecting circuits and two second connecting circuits, wherein an end of each of the first connecting circuits is electrically connected to the PCB. The probe base is provided between the substrate and the DUT. The probes are embedded in the probe base, wherein each of the probes has two opposite ends exposed outside of the probe base to be connected to an end of one of the second connecting circuits and to contact a tested pad of the DUT respectively. The signal path switchers are provided on the probe base, wherein each of the signal path switchers is electrically connected to another ends of one of the first connecting circuits and one of the second connecting circuits. The capacitor is provided on the probe base, wherein two ends of the capacitor are respectively electrically connected to the signal path switchers.

In an embodiment, each of the signal path switchers is an inductive device having two ends, which are respectively electrically connected to one of the first connecting circuits and to the capacitor and one of the second connecting circuits.

In an embodiment, each of the signal path switchers is a relay having a first contact, a second contact, and a third contact, wherein the relay is controllable to make either a connection between the first contact and the second contactor, or another connection between the first contact and the third contact; the first contact is electrically connected to one of the second connecting circuits, the second contact is electrically connected to one of the first connecting circuits, and the third contact is electrically connected to the capacitor.

Whereby, the distance to transmit high-frequency signals can be effectively shortened, and the inductance generated on the signal paths is consequently reduced. Therefore, high-frequency test signals can be successfully transmitted to the DUT to be correctly detected.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

Figure 1:
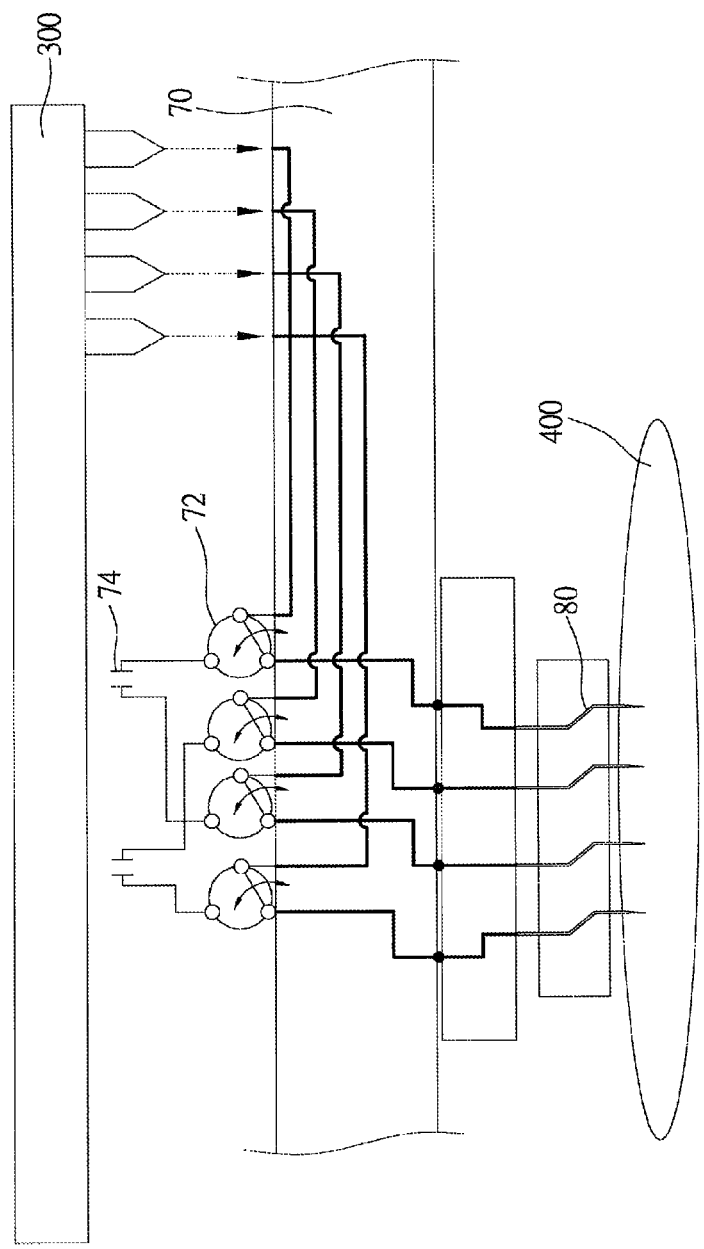
FIG. 1 is a structural diagram of a conventional probe card.
Figure 2:
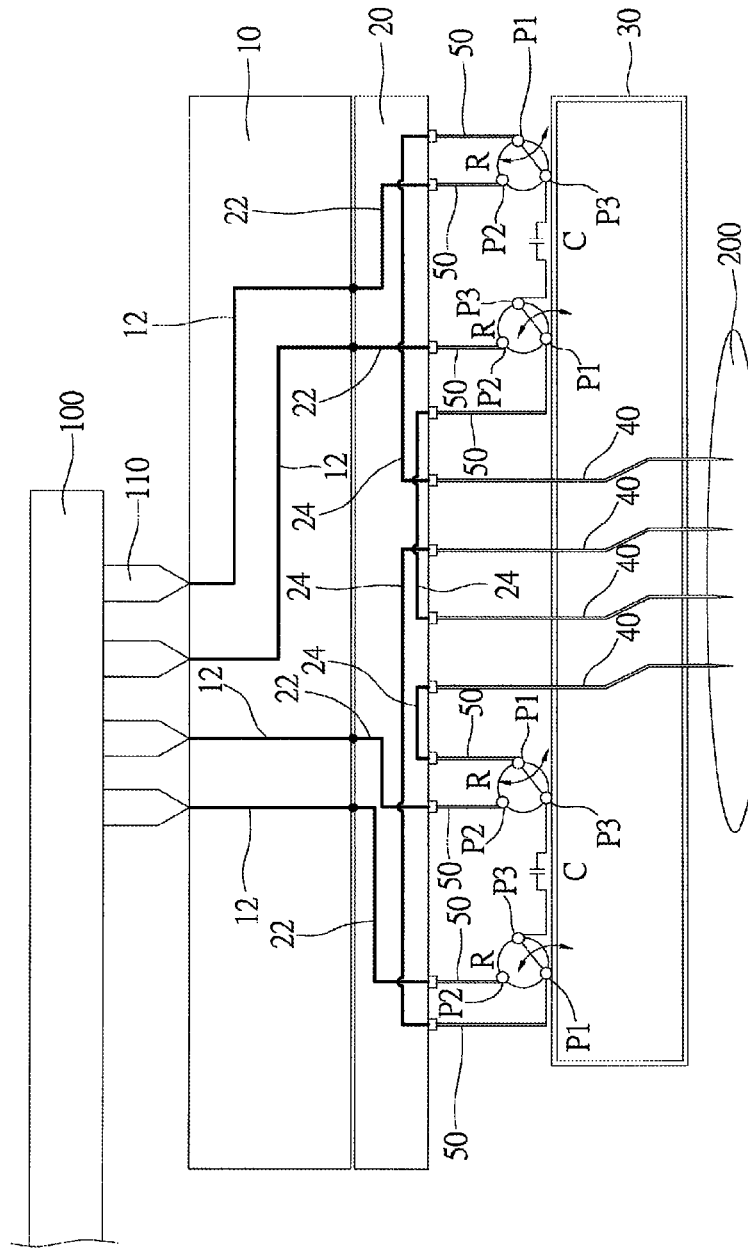
FIG. 2 is a structural diagram of the probe card which contains the probe module of a first preferred embodiment of the present invention.

As shown in FIG. 2, a probe card which contains a probe module of the first preferred embodiment of the present invention is provided between a tester 100 and a DUT 200, wherein the probe card further contains a PCB 10 in addition to the probe module. The PCB 10 has a plurality of signal circuits 12 laid within, wherein each signal circuit 12 has two ends. One end of each signal circuit 12 is connected to a test terminal 110 of the tester 100, while the other end forms a conductive land on a bottom surface of the PCB 10. As to the probe module, it contains a substrate 20, a probe base 30, four probes 40, four relays R, a plurality of conductors 50, and two capacitors C.

In the first preferred embodiment, the substrate 20 is a multilayer ceramic board embedded with a plurality of first connecting circuits 22 and a plurality of second connecting circuits 24. Each first connecting circuit 22 and each second connecting circuit 24 both has two ends, wherein each first connecting circuit 22 is respectively connected to one of the signal circuits 12 of the PCB 10 with one of the ends thereof, while the other end of each first connecting circuit 22 and both the two ends of each second connecting circuit 24 respectively form a conductive land on a bottom surface of the substrate 20.

The probe base 30 is a hollow cuboid, and it is provided above the DUT 200 for the probes 40 to be installed thereon. A distance between each two neighboring probes 40 can be fixed in this way. Each probe 40 has a top end and a bottom end which is opposite to the top end, and the top end and the bottom end are exposed outside of the probe base 30, wherein the top end is electrically connected to one of the ends of one of the second connecting circuits 24 by being connected to the corresponding conductive land on the bottom surface of the substrate 20, while the bottom end, which is a tip in the first preferred embodiment, contacts a tested pad on the DUT 200.

The relays R are welded on a surface of the probe base 30 which faces the substrate 20, and are between the probe base 30 and the substrate 20. Moreover, a volume of each relay R is preferable to be smaller than 125 cm$^3$ for the purpose of thin design, and more specifically, a height (in a direction from the DUT 200 toward the tester 100) of the relays R is preferable to be shorter than 5 mm. In the first preferred embodiment, the volume of each relay R is 27 mm$^3$, which is 3 mm in height, width, and depth thereof. Furthermore, each relay R has a first contact P1, a second contact P2, and a third contact P3, wherein each relay R either makes a connection between the first contact P1 and the second contact P2 or makes a connection between the first contact P1 and the third contact P3 under control of a wire or a flexible PCB (not shown) connected to the tester 100.

In the first preferred embodiment, each conductor 50 is a flexible metal thimble which has two ends. Some of the conductors 50 are respectively connected to the first contact P1 of each relay R with one of the ends thereof, while the other end of each of these conductors 50 is respectively connected to one of the conductive lands on the bottom surface of the substrate 20. More specifically, the first contact P1 of each relay R is respectively electrically connected to one of the ends of each second connecting circuit 24 through one of the conductors 50. Meanwhile, the rest of the conductors 50 are respectively connected to the second contact P2 of each relay R with one of the ends thereof, while the other end of each of these conductors 50 is respectively connected to one of the rest conductive lands on the bottom surface of the substrate 20 in a way that the second contact P2 of each relay R is respectively electrically connected to one of the ends of each first connecting circuit 22.

The two capacitors C are welded on the surface of the probe base 20 which faces the substrate 20, and are between the probe base 30 and the substrate 20. Furthermore, two ends of one of the capacitors C are respectively electrically connected to the third contacts P3 of two of the relays R, while two ends of the other capacitor C are respectively electrically connected to the third contacts R3 of the other two relays R.

Figure 3:
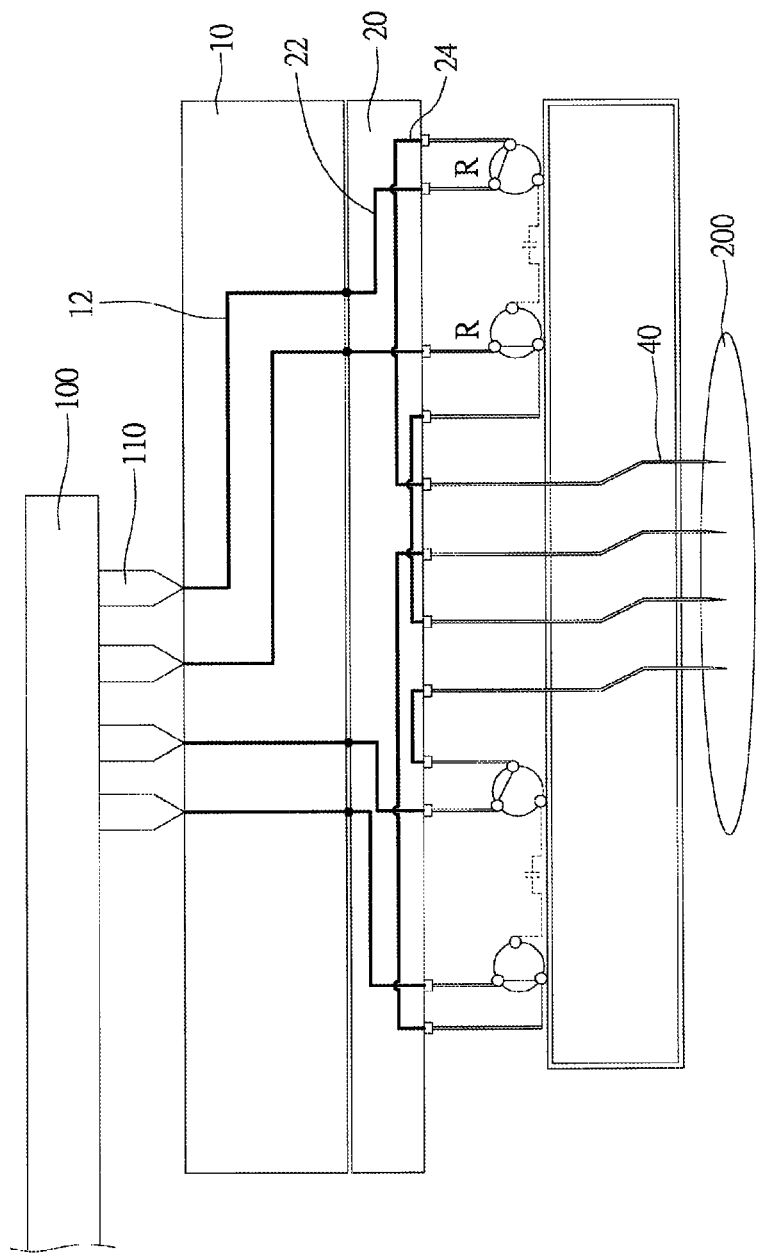
FIG. 3 is a sketch diagram showing the signal paths in the probe card shown in FIG. 2 while transmitting DC or low-frequency signals.

Whereby, when direct current (DC) or low-frequency test signals are outputted from the test terminals 110 of the tester 100, each corresponding relay R is controlled to make the connection between the first contact P1 and the second contact P2, and to break the connection between the first contact P1 and the third contact P3. Signal paths for transmitting the signals at this time point are shown in FIG. 3, wherein once a test signal is outputted from any one of the test terminals 110 of the tester 100, it is transmitted sequentially through one of the signal circuits 12 of the PCB 10, one of the first connecting circuits 22 of the substrate 20, one of the relays R, one of the second connecting circuits 24 of the substrate, one of the probes 40, and finally the DUT 200; after that, the test signal is transmitted sequentially through another one of the probes 40, another one of the second connecting circuits 24, another one of the relays R, another one of the first connecting circuits 22, another one of the signal circuits 12, and finally returns back to the tester 100 through another one of the test terminals 110. As a result, the signal path of the test signal becomes a loop for performing test.

Figure 4:
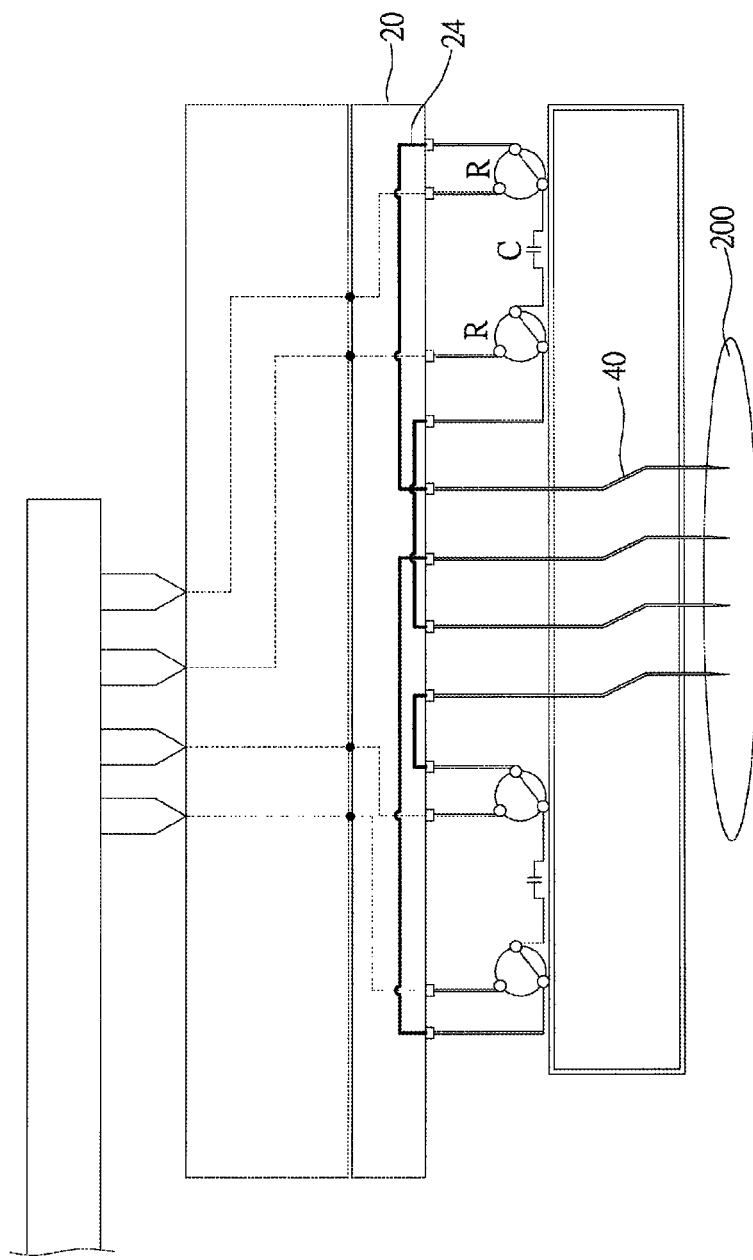
FIG. 4 is a sketch diagram showing the signal paths in the probe card shown in FIG. 2 while transmitting high-frequency signals.

In contrary, when high-frequency test signals are outputted by the DUT 200 in order to perform a loopback test, each corresponding relay R is controlled to make the connection between the first contact P1 and the third contact P3, and to break the connection between the first contact P1 and the second contact P2. Signal paths of transmitting the signals at this time point are shown in FIG. 4, wherein once a test signal is outputted by the DUT 200, it is transmitted sequentially through one of the probes 40, one of the second connecting circuits 24 of the substrate 20, one of the relays R, and one of the capacitors C. And then, the signal is transmitted continuously through another one of the relays R, another one of the second connecting circuits 24, another one of the probes 40, and finally returns back to the DUT 200, which makes the signal path of the signal become a shorter loop to perform a loopback test.

With the aforementioned design, the distance for transmitting high-frequency signals can be effectively shortened, which not only greatly reduces resistance along the signal paths, but also effectively prevents the high-frequency signals from being interfered by electric components or circuits on the PCB 10. Therefore, the high-frequency test signals which return back to the DUT 200 can be easily recognized.

Figure 5:
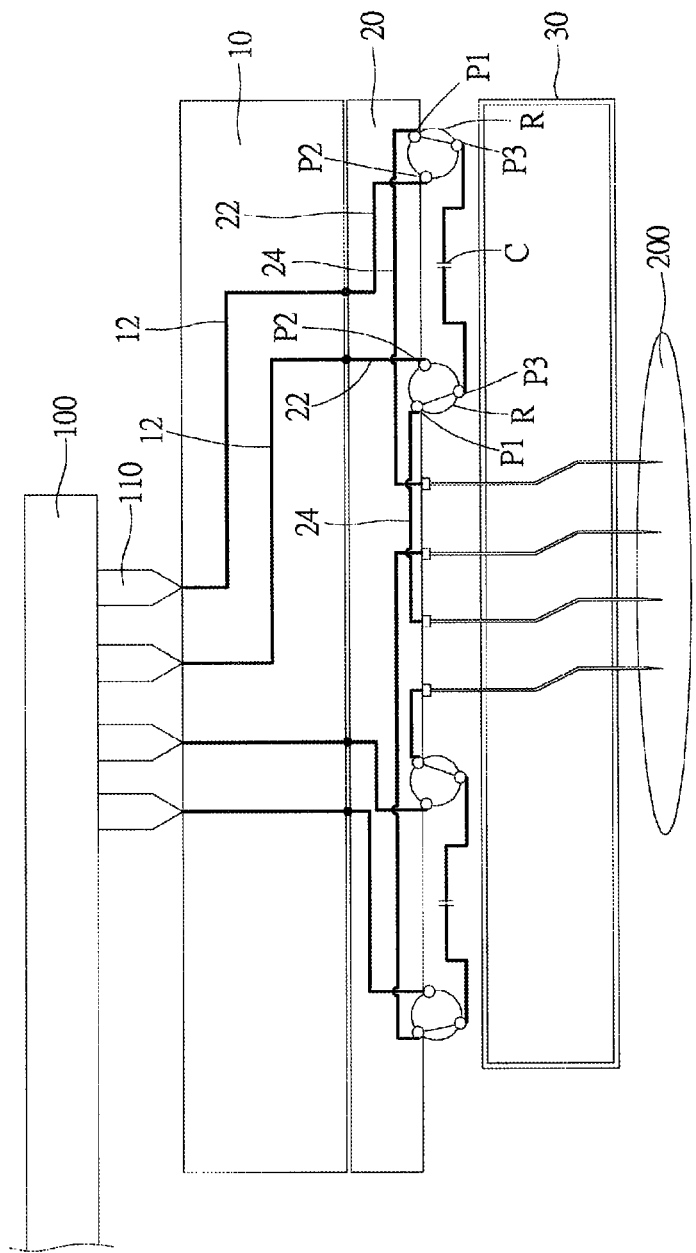
FIG. 5 is a structural diagram of the probe card which contains the probe module of a second preferred embodiment of the present invention.

As shown in FIG. 5, a probe module of the second preferred embodiment of the present invention is basically the same with the first preferred embodiment, except that the relays R and the capacitors C are welded on the probe base 20, and directly electrically connected to the first connecting circuits 22 and the second connecting circuits 24. Therefore the distance to transmit high-frequency signals is further shortened due to the omission of the conductors 50.

Figure 6:
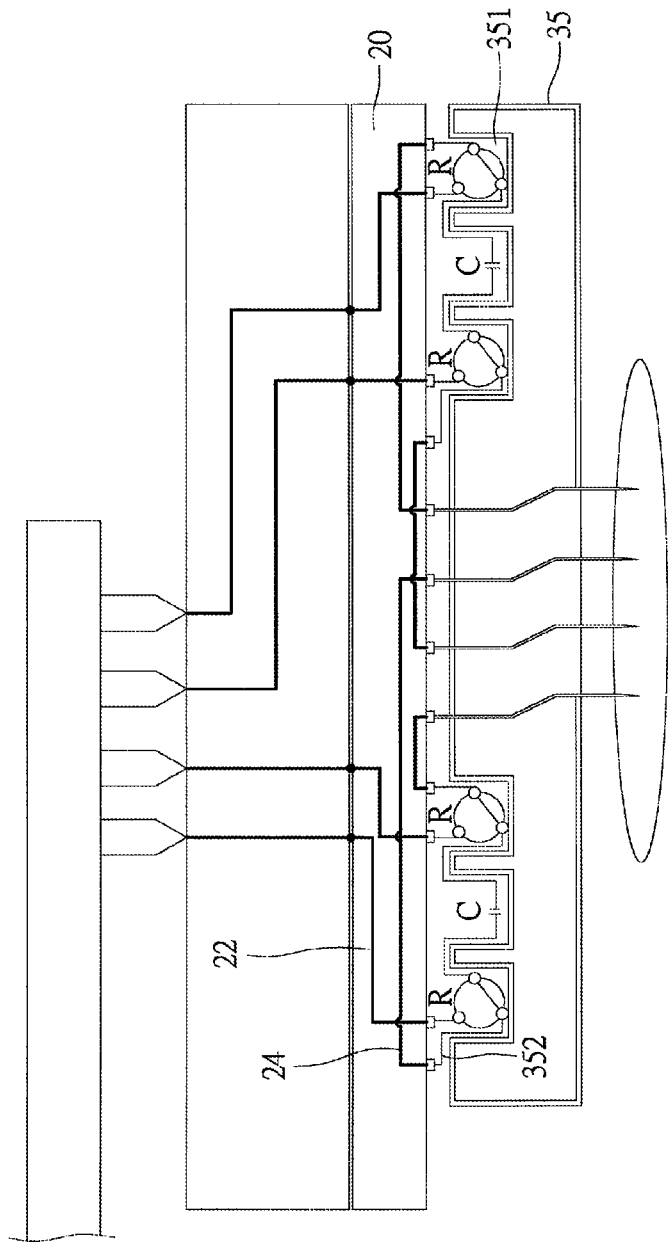
FIG. 6 is a structural diagram of the probe card which contains the probe module of a third preferred embodiment of the present invention.

In order to make the design even thinner, a probe module of the third preferred embodiment shown in FIG. 6 has six recesses 351 on a top surface of the probe base 35, wherein the relays R and the capacitors C are respectively received in the recesses 351. A plurality of conducting circuits 352 are laid on the probe base 35 to electrically connect each relay R and the corresponding capacitor C, wherein each conducting circuit 352 is further connected to the bottom surface of the substrate 20 to electrically connect one of the relays R, one of the first connecting circuits 22, and one of the second connecting circuits 24. The distance for transmitting high-frequency signals is further shortened as mentioned above in this way.

Figure 7:
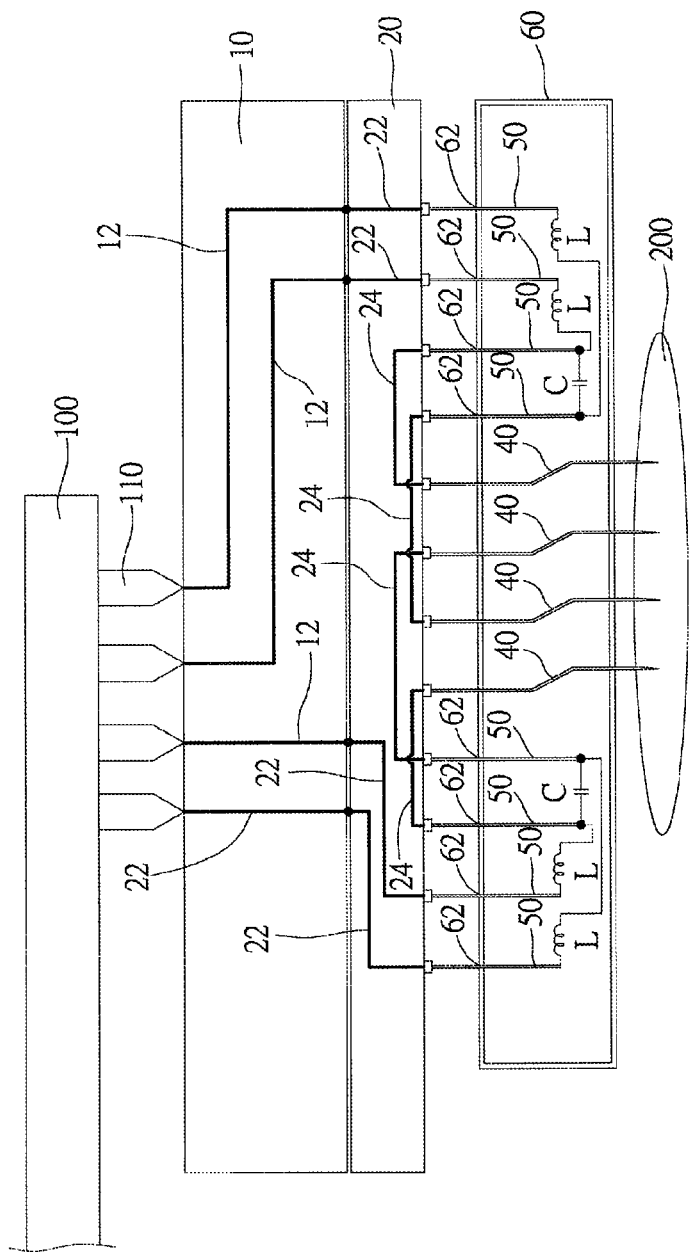
FIG. 7 is a structural diagram of the probe card which contains the probe module of a fourth preferred embodiment of the present invention.

A probe module of the fourth preferred embodiment shown in FIG. 7 includes a substrate 20, a probe base 60, four probes 40, four inductive devices L, a plurality of conductors 50, and two capacitors C, wherein the substrate 20, the probes 40, the conductors 50, and the capacitors C are the same with those of the first preferred embodiment, so we are not going to describe them in detail again. The difference between the first and the fourth preferred embodiment is that the inductive devices L are used as signal path switchers to switch signal paths. In the fourth preferred embodiment, each inductive device L is a choke, but they can be displaced by other inductive components such as coils, windings, or beads. In addition, the inductive devices L and the capacitors C are welded inside the probe base 60, and therefore a plurality of through holes 62 are provided on the surface of the probe base 60 which faces the substrate 20 to accommodate the conductors 50 therein, wherein two ends of each inductive device L are respectively electrically connected to one of the ends of two of the conductors 50, while the other ends of the two conductors are respectively electrically connected to the corresponding one of the first connecting circuits 22 and the corresponding one of the second connecting circuits 24. In other words, each inductive device L is electrically connected to one of the first connecting circuits 22 and one of the second connecting circuits 24 through the conductors 50. Moreover, the two ends of one of the capacitors C are respectively electrically connected to the ends of two of the inductive devices L which are electrically connected to two of the second connecting circuits 24, while the two ends of the other capacitor C are respectively electrically connected to the ends of the other two inductive devices L which are electrically connected to two of the second connecting circuits 24.

Whereby, when DC or low-frequency test signals are outputted from the test terminals 110 of the tester 100, the inductive devices L either are short or possess low resistance, and the capacitors C either are open or possess high resistance. Signal paths for transmitting the signals at this time point are shown in FIG. 7, wherein once a test signal is outputted from any one of the test terminals 110 of the tester 100, it is transmitted sequentially through one of the signal circuits 12 of the PCB 10, one of the first connecting circuits 22 of the substrate 20, one of the inductive devices L, one of the second connecting circuits 24 of the substrate, one of the probes 40, and finally the DUT 200; after that, the test signal is transmitted sequentially through another one of the probes 40, another one of the second connecting circuits 24, another one of the inductive devices L, another one of the first connecting circuits 22, another one of the signal circuits 12, and finally returns back to the tester 100 through another one of the test terminals 110. As a result, the signal path of the test signal becomes a loop for performing test.

Figure 8:
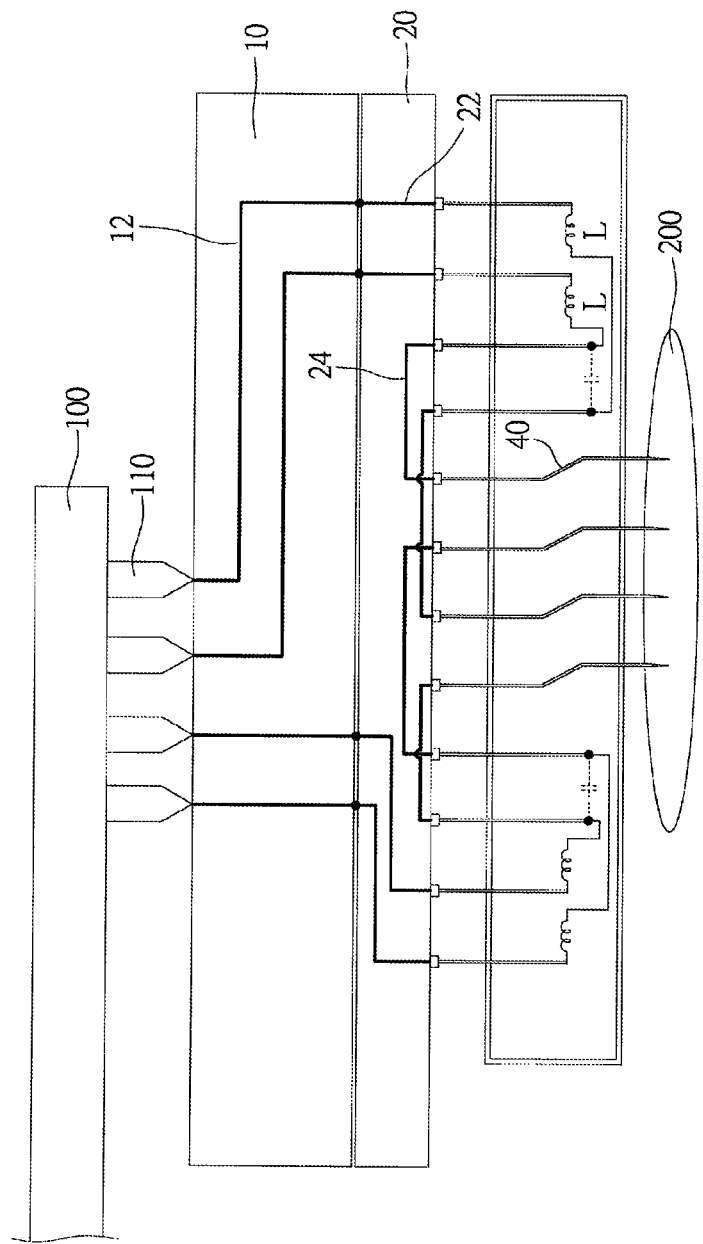
FIG. 8 is a sketch diagram showing the signal paths in the probe card shown in FIG. 7 while transmitting direct current or low-frequency signals.
Figure 9:
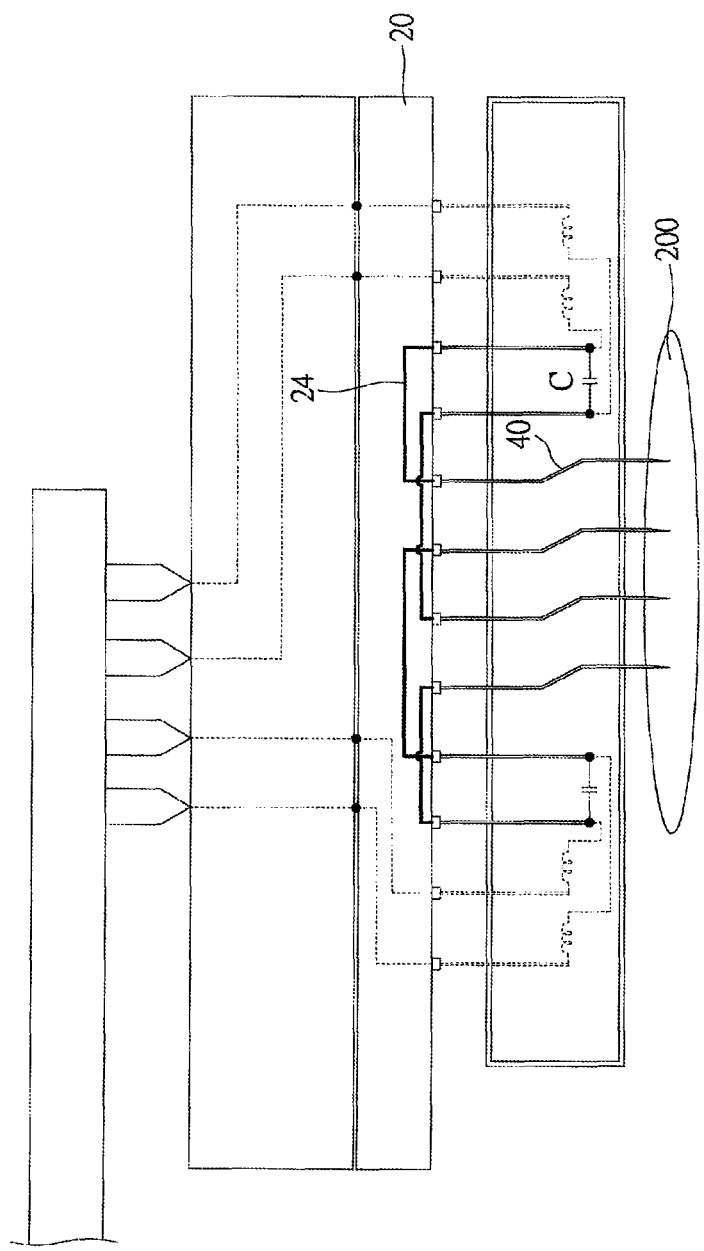
FIG. 9 is a sketch diagram showing the signal paths in the probe card shown in FIG. 7 while transmitting high-frequency signals.

In contrary, when high-frequency test signals are outputted by the DUT 200 in order to perform a loopback test, the capacitors C either are short or possess low resistance, and the inductive devices L either are open or possess high resistance. Signal paths of transmitting the signals at this time point are shown in FIG. 8, wherein once a test signal is outputted by the DUT 200, it is transmitted sequentially through one of the probes 40, one of the second connecting circuits 24 of the substrate 20, and one of the capacitors C. And then, the signal is transmitted continuously through another one of the second connecting circuits 24, another one of the probes 40, and finally returns back to the DUT 200, which makes the signal path of the signal become an extremely short loop to perform a loopback test.

With the aforementioned design of the fourth preferred embodiment of the present invention, the signal paths can be switched in real time without the need of additional electricity due to different electrical properties of the passive components (e.g., the inductive devices L and the capacitors C) in reaction to signals of different frequencies. In addition, the distance for transmitting high-frequency signals are further shortened, and the resistance generated along the signal paths is enormously reduced as well. Therefore the high-frequency test signals which return back to the DUT 200 can be easily recognized.

Figure 10:
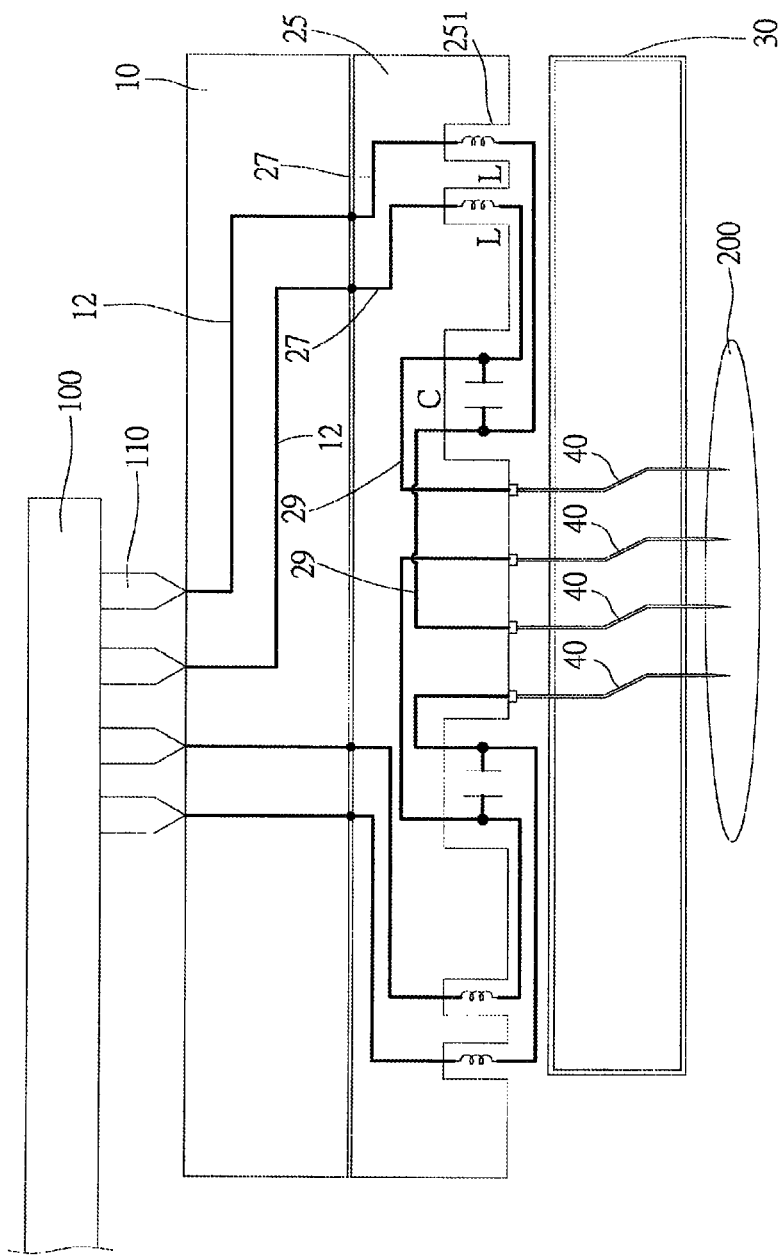
FIG. 10 is a structural diagram of the probe card which contains the probe module of a fifth preferred embodiment of the present invention.

As shown in FIG. 10, a probe module of the fifth preferred embodiment of the present invention also includes a substrate 25, a probe base 30, four probes 40, four inductive devices L, and two capacitors C, wherein the probe base 30, the probes 40, and the capacitors C are the same with those of the aforementioned preferred embodiments, so we are not going to describe them in details either. The difference between the fifth preferred embodiment and the aforementioned preferred embodiments is that there are six recesses 251 formed on a surface of substrate 25 which faces the probes 40, and the inductive devices L and the capacitors C are respectively received in the recesses 251. Furthermore, a conducting circuit is laid on the substrate 25 to electrically connect each inductive device L and the corresponding capacitor C. In more details, each inductive device L is electrically connected to one of the first connecting circuits 27 and one of the second connecting circuits 29, while two ends of the corresponding capacitor C are respectively electrically connected to the corresponding two of the second connecting circuits 29. The distance for transmitting high-frequency signals are further shortened as mentioned above in this way.

It must be pointed out that the embodiments described above are only some preferred embodiments of the present invention. All equivalent structures which employ the concepts disclosed in this specification and the appended claims should fall within the scope of the present invention.

What is claimed is:

1. A probe module, which is provided between a printed circuit board (PCB) and a device-under-test (DUT) to perform a loopback test, comprising:
   a substrate having two first connecting circuits and two second connecting circuits, wherein an end of each of the first connecting circuits is electrically connected to the PCB;
   a probe base provided between the substrate and the DUT;
   two probes embedded in the probe base, wherein each of the probes has two opposite ends exposed outside of the probe base to be connected to an end of one of the second connecting circuits and to contact a tested pad of the DUT respectively;
   two signal path switchers provided on the probe base, wherein each of the signal path switchers is electrically connected to another ends of one of the first connecting circuits and one of the second connecting circuits; and
   a capacitor provided on the probe base, wherein two ends of the capacitor are respectively electrically connected to the signal path switchers;
   wherein the probe base is hollow, and the signal path switchers and the capacitor are either provided on a surface of the probe base which faces the substrate or received in the probe base.

2. The probe module of claim 1, wherein each of the signal path switchers is an inductive device having two ends, which are respectively electrically connected to one of the first connecting circuits and to the capacitor and one of the second connecting circuits.

3. The probe module of claim 2, wherein each of the inductive devices is a choke.

4. The probe module of claim 1, wherein each of the signal path switchers is a relay having a first contact, a second contact, and a third contact, wherein the relay is controllable to make either a connection between the first contact and the second contactor, or another connection between the first contact and the third contact; the first contact is electrically connected to one of the second connecting circuits, the second contact is electrically connected to one of the first connecting circuits, and the third contact is electrically connected to the capacitor.

5. The probe module of claim 1, wherein, when the signal path switchers and the capacitor are provided on the surface of the probe base which faces the substrate, the probe base is provided with a plurality of recesses on the surface facing the substrate, and the signal path switchers are respectively received in the recesses.

6. The probe module of claim 1, wherein, when the signal path switchers and the capacitor are provided on the surface of the probe base which faces the substrate, the probe base is provided with a recess on the surface facing the substrate, and the capacitor is received in the recess.

7. The probe module of claim 1, further comprising a plurality of conductors when the signal path switchers and the capacitor are received in the probe base, wherein the probe base is provided with a plurality of through holes on a surface facing the substrate to respectively accommodate the conductors therein; each conductor has one end electrically connected to one of the signal path switchers and another end which contacts one of the first connecting circuits or one of the second connecting circuits in a way that each of the signal path switchers is electrically connected to one of the first connecting circuits and one of the second connecting circuits.

8. The probe module of claim 7, wherein each of the conductors is a flexible metal thimble.

9. A probe module, which is provided between a PCB and a DUT to perform a loopback test, comprising:
   a substrate having two first connecting circuits and two second connecting circuits, wherein an end of each of the first connecting circuits is electrically connected to the PCB;
   two probes having two opposite ends, wherein one of the ends of each of probes is electrically connected to an end of one of the second connecting circuits, while the other end thereof contacts a tested pad of the DUT;
   two signal path switchers provided on the substrate, wherein each of the signal path switchers is electrically connected to another ends of one of the first connecting circuits and one of the second connecting circuits; and
   a capacitor provided on the substrate, wherein two ends of the capacitor are respectively electrically connected to the signal path switchers;
   wherein the signal path switchers and the capacitor are provided on a surface of the substrate which faces the probes.

10. The probe module of claim 9, wherein each of the signal path switchers is an inductive device having two ends, which are respectively electrically connected to one of the first connecting circuits and to the capacitor and one of the second connecting circuits.

11. The probe module of claim 10, wherein each of the inductive devices is a choke.

12. The probe module of claim 9, wherein each of the signal path switchers is a relay having a first contact, a second contact, and a third contact, wherein the relay is controllable to make either a connection between the first contact and the second contactor, or another connection between the first contact and the third contact; the first contact is electrically connected to one of the second connecting circuits, the second contact is electrically connected to one of the first connecting circuits, and the third contact is electrically connected to the capacitor.

13. The probe module of claim 9, wherein the substrate is provided with a plurality of recesses on the surface facing the probes, and the signal path switchers are respectively received in the recesses.

14. The probe module of claim 9, wherein the substrate is provided with a recess on the surface acing the probes, and the capacitor is received in the recess.

15. The probe module of claim 9, further comprising a probe base provided between the substrate and the DUT, wherein the probes are provided on the probe base; each of the probes has two opposite ends exposed outside of the probe base to be electrically connected to one of the second connecting circuits and to contact the tested pad of the DUT respectively.

* * * * *